(12) United States Patent
Lercel

(10) Patent No.: US 6,555,297 B1
(45) Date of Patent: Apr. 29, 2003

(54) ETCH STOP BARRIER FOR STENCIL MASK FABRICATION

(75) Inventor: Michael J. Lercel, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/624,921

(22) Filed: Jul. 25, 2000

(51) Int. Cl.⁷ .................................. G03C 5/00
(52) U.S. Cl. .................. 430/313; 430/5; 430/317; 430/314; 430/322; 430/323; 430/324; 430/296
(58) Field of Search ............... 430/5, 296, 313, 430/314, 317, 322, 324, 323

(56) References Cited

U.S. PATENT DOCUMENTS

| | | | |
|---|---|---|---|
| 5,858,576 A | 1/1999 | Takashi et al. ............ 430/5 |
| 5,876,881 A | 3/1999 | Kawata ................... 430/5 |
| 5,899,728 A | 5/1999 | Mangat et al. .......... 438/459 |
| 5,905,005 A | 5/1999 | Yabe et al. .............. 430/5 |
| 6,261,726 B1 * | 7/2001 | Brooks et al. .......... 250/492.2 |
| 6,297,170 B1 * | 10/2001 | Gabriel et al. ......... 438/735 |

* cited by examiner

Primary Examiner—Mark F. Huff
Assistant Examiner—Daborah Chacko-Davis

(57) ABSTRACT

Methods are provided for making stencil masks from a mask substrate preferably having sequential layers of a backside hardmask, a mask substrate, a stencil pattern forming layer and preferably a frontside hardmask layer. In one method a backside protective layer is formed after a backside etch and substrate window etch to protect the stencil pattern forming layer during the stencil pattern forming layer etching process. In another method of the invention, a frontside protective layer is provided over the etched stencil pattern forming layer surface before the substrate layer etch to form a mask window. In both methods enhanced control of critical dimensions of the mask and profile control are achieved since are backside cooling of the substrate during making of the mask can be used during the mask fabrication process.

18 Claims, 1 Drawing Sheet

ETCH STOP BARRIER FOR STENCIL MASK FABRICATION

BACKGROUND OF THE INVENTION

1. Field of the Invention

This invention relates to the making of semiconductor devices using lithographic masks to expose circuit patterns on the device, and, more particularly, to lithographic masks and a method of making lithographic masks such as a stencil mask which are used with electron beams, ion beams or photon beam lithography techniques to pattern the device.

2. Description of Related Art

Exposure masks are used in lithographic techniques during the manufacture of integrated circuits to define circuit features on a wafer. During construction of the mask, a pattern of the circuit features to be exposed onto the wafer is formed on the mask substrate. The mask is placed in a position to overlie the semiconductor wafer and an energy beam passes through the mask which exposes a suitable sensitized film covering the wafer in the pattern on the mask. When the wafer is exposed, the pattern on the mask is reproduced in a sensitized film. Subsequent processing, such as developing the sensitized film, etching, etc. in accordance with a particular lithographic technique being used produces the circuit pattern on the mask on the surface of the wafer to define the desired circuit patterns.

The tendency of integrated circuits in semiconductor technology, however, is to ever decreasing structured dimensions in order to increase the density of the circuits and their switching speed. Optical photo lithography, which is still used today in the majority of cases, is approaching the limits dictated by the physical resolution of optical systems. The most promising methods for the production of devices having finer lines and circuits are x-ray and electron beam processes which employ stencil masks.

With continued advances in the miniaturization of circuit patterns, and the consideration of the resolution limitations of light, much recent research on microlithography has been directed to the use of shorter-wave length electromagnetic radiation such as x-rays or charged-particle beams such as electron beams, ion beams, etc. rather than visible or UV light. Such masks generally comprise a silicon mask substrate with defined patterned through-holes in the substrate. The pattern defined by the array of holes or voids is transferred to the sensitive substrate of the semiconductor device and such masks are conventionally termed "stencil masks".

In the formation of stencil masks especially for advanced lithography techniques such as electron beam, ion beam or photon beam lithography, typically the membrane is defined first then the patterns are etched into the membrane. This order is chosen for stress and image placement control and for membrane etch yield issues. However, this prevents the pattern etch (if performed with a reactive ion etch) from using any backside cooling of the membrane. The lack of backside cooling usually leads to loss of control of critical dimensions. An additional disadvantage of prior art methods is pattern profile degradation such as notching or tapering near the bottom edge of the membrane.

A number of patents have issued with regard to mask fabrication including U.S. Pat. Nos. 5,858,576; 5,876,881; 5,899,728; and 5,905,005. All of the above patents are hereby incorporated by reference.

In the prior art methods for forming stencil and lithographic masks backside cooling of the membrane is limited and bearing in mind the problems and deficiencies of the prior art, it is therefore an object of the present invention to provide a method for making stencil and other lithographic masks used in the manufacture of semiconductor devices.

It is another object of the present invention to provide lithographic masks including stencil masks made by the method of the invention.

A further object of the invention is to provide semiconductor devices made using the lithographic mask of the invention.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of making a stencil or other lithographic mask comprising the steps of:

obtaining a lithographic mask substrate having an upper surface and a lower surface;

etching the lower surface of the substrate to form window openings therein;

depositing a protective layer over the lower surface and window openings of the etched substrate;

etching the upper surface of the substrate forming the desired stencil pattern in the substrate; and removing the protective layer forming the mask.

In a preferred aspect the substrate has a stencil pattern forming layer on the upper surface thereof (which layer may be also termed a membrane layer) which layer is etched to form the stencil pattern therein after the protective layer is applied.

In another aspect, a method of making a stencil or other lithographic mask is provided comprising the steps of:

obtaining a lithographic mask substrate comprising sequential layers of, from bottom to top, a backside mask layer, a window forming substrate layer, a stencil pattern forming layer and optionally a frontside mask layer, each layer having a lower surface and an upper surface;

etching the backside mask layer to form one or more patterned backside openings;

etching the window forming substrate layer to form window openings therein and exposing a portion of the lower surface of the stencil pattern forming layer;

depositing a protective layer over the etched backside mask layer and etched window forming substrate layer and the exposed portion of the lower surface of the stencil pattern forming layer;

depositing an imageable resist layer on the stencil pattern forming layer upper surface or on the optional frontside mask layer upper surface if used;

patterning the imageable resist;

etching the stencil pattern forming layer or the optional frontside mask layer forming the pattern on the stencil pattern forming layer or optional frontside mask layer;

etching the stencil pattern forming layer in the pattern on the frontside mask layer if a frontside mask layer was used;

removing the resist layer; and removing the protective layer forming the mask.

In another aspect of the invention, a method is provided for making a lithographic mask such as a stencil mask comprising the steps of:

obtaining a lithographic mask substrate having an upper surface and a lower surface;

etching the upper surface of the substrate forming the stencil pattern;

depositing a frontside protective layer on the etched substrate upper surface;

etching the lower surface of the substrate forming window openings in the substrate; and removing the frontside protective layer forming the mask.

In another aspect, the substrate has a stencil pattern forming layer on the upper surface thereof which layer is etched to form the stencil pattern therein and then the frontside protective layer deposited and the method continued.

In a further aspect of the invention, a method is provided for making a lithographic mask such as a stencil mask comprising the steps of:

obtaining a lithographic mask substrate comprising sequential layers, from bottom to top, of a backside mask layer, a window forming substrate layer, a stencil pattern forming layer and optionally a frontside mask layer, each layer having a lower surface and an upper surface;

etching the backside mask layer to form one or more patterned backside openings;

depositing an imageable resist layer on the upper surface of the stencil pattern forming layer or the optional frontside mask layer;

patterning the imageable resist layer;

etching the stencil pattern forming layer or the optional frontside mask layer forming the pattern;

etching the stencil pattern forming layer in the pattern on the frontside mask layer if a frontside mask layer was used;

removing the resist layer;

depositing a frontside protective layer on the etched stencil pattern forming layer surface;

etching the window forming substrate layer forming window forming substrate layer openings and exposing a portion of the lower surface of the patterned stencil pattern forming layer; and removing the frontside protective layer forming the mask.

In another aspect of the invention a method is provided for making semiconductor devices using the lithographic masks of the invention wherein the mask is positioned to overlie the semiconductor device to be patterned and an energy beam passed through the mask and directed to the surface of the semiconductor device which is covered with a sensitive resist. The resist is thereby exposed in the desired pattern and after conventional techniques of developing and etching the resist, the desired circuit pattern is formed on the semiconductor device.

In a further aspect of the invention semiconductor devices made using the method of the invention are provided.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1A:
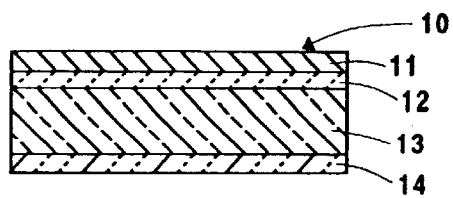
FIGS. 1A–1G are schematic sectional views showing a method of the invention for making a stencil mask.

In describing the preferred embodiment of the present invention, reference will be made herein to FIGS. 1A–2H of the drawings in which like numerals refer to like features of the invention. Features of the invention are not necessarily shown to scale in the drawings.

Referring first to FIGS. 1A–1G a method of the invention for making a stencil mask is shown.

In FIG. 1A a substrate for making a mask is shown in composite as numeral 10. The mask substrate comprises, in sequential layers from the bottom layer to the top layer, a backside hardmask layer 14, a silicon substrate layer 13, a stencil pattern forming layer 12 and a top frontside hard mask layer 11. The backside hardmask layer 14 is typically silicon nitride, silicon carbide or boron-doped silicon. Silicon nitride and silicon carbide are typically formed on the substrate 13 by chemical vapor eposition (CVD) and boron doped silicon by diffusion. The backside hardmask layer 4 is generally about 0.2 to 5 $\mu$m thick. The substrate layer 13 is typically silicon and is generally about 500 to 1,000 $\mu$m thick. The stencil pattern forming layer 12 is typically silicon and may also be diamond or silicon carbide. The thickness of the stencil pattern forming layer is generally 0.5 to 5 $\mu$m and silicon layers are formed by diffusion whereas diamond and SiC layers are formed by CVD. The frontside hardmask layer 11 is typically $SiO_2$ and may be silicon nitride, silicon oxynitride (SiON) or a metal layer and has a thickness of about 0.1 to 1 $\mu$m. The frontside hardmask layer is optional, but preferred, and a resist can be used to directly image the stencil patterns into the stencil pattern forming layer 12. Such a mask base substrate is prepared using conventional techniques such as CVD deposition. Photolithographic definition is used to image the pattern into a resist layer on the backside of the mask.

Figure 1B:
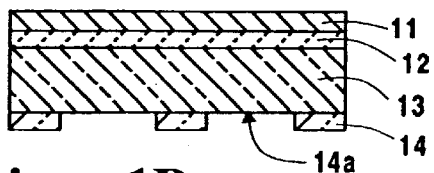
Figure 1C:
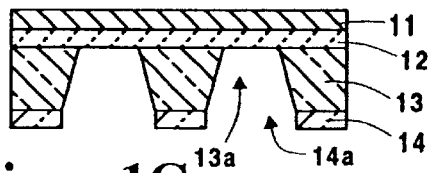

Referring now to FIG. 1B, the backside hardmask layer 14 is etched to form patterned openings 14a in the layer. In FIG. 1C the silicon substrate 13 is etched forming windows 13a above openings 14a. Thus, the stencil pattern forming layer 12 is now open and exposed below substrate layer openings 13a and backside hard mark openings 14a. These openings are typically referred to as windows so that an energy beam directed to the surface of the mask will pass through stencil pattern openings in the stencil pattern forming layer and pass through the window to the surface of the semiconductor device which is positioned below the mask.

Figure 1D:
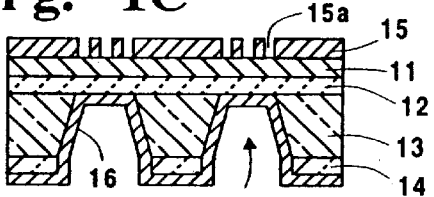

In FIG. 1D a resist layer 15 was formed on the surface of frontside hardmask 11 and is shown patterned with openings 15a. Any suitable resist may be used as is well-known in the art. Also shown in FIG. 1D is a protective layer 16 applied to the lower surface of the backside hardmask layer 14, the walls defined by the openings 13a and 14a and the lower surface of stencil pattern forming layer 12. The protective layer 16 may be SiON, $SiO_2$, SiC, silicon nitride ($Si_3N_4$), metal such as Ti and Cr, metal oxide such as aluminum oxide, chromium oxide, indium tin oxide and titanium oxide or metal nitrides such as titanium nitride and aluminum nitride and is usually applied by PECVD (plasma enhanced CVD) but could also be applied by CVD, sputtering, evaporation or spin-on (from liquid phase). SiON applied by PECVD is preferred.

Figure 1E:
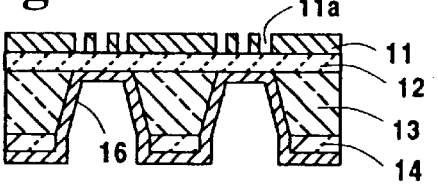

In FIG. 1E the frontside hardmask layer 11 (which is optional) is etched forming the pattern of the resist layer 15 shown as openings 11a.

Figure 1F:
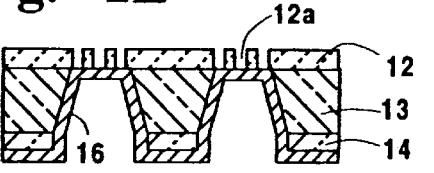

FIG. 1F shows etching of the stencil pattern forming layer 12 in the pattern of the frontside hard mask layer 11 to form openings 12a in the stencil pattern forming layer 12. This is the desired circuit pattern to be on the mask.

Figure 1G:
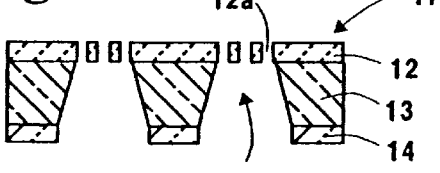

The protective layer 16 is then removed as shown in FIG. 1G forming the final stencil mask shown as numeral 17.

Following the method of the invention as shown in FIGS. 1A–1G an efficient and cost effective method for making a stencil mask 17 is provided. In the process it is possible and preferable to use backside cooling below backside hardmask layer 14 during the process as is conventional in the art. Such cooling assists in control of critical dimensions in the mask pattern and profile control. The above method is the preferred method and it will appreciated by those skilled in the art that neither the frontside hardmask nor the backside hardmask are needed to form the mask of the invention but that a stencil mask forming substrate containing these layers is preferred.

Referring now to FIGS. 2A–2H another method of the invention to make a stencil mask is shown. Thus, in FIG. 2A a mask substrate for making a stencil mask is shown in composite as numeral 18. The mask substrate 18 comprises, in sequential layers from the bottom layer to the top layer, a backside hardmask layer 22, a substrate layer 21, a stencil pattern forming layer 20 and an upper frontside hardmask layer 19. This mask substrate 18 may be made by conventional techniques and utilizing similar materials as described above.

Figure 2A:
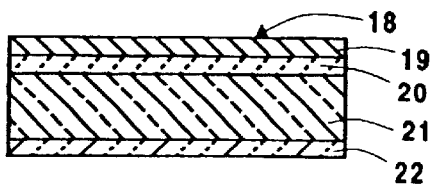
FIGS. 2A–2H are schematic sectional views showing another method of the invention for making a stencil mask.
Figure 2B:
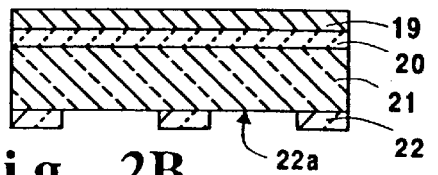

In FIG. 2B the first step in the process is to etch the backside hardmask layer 22 forming openings therein shown as 22a.

Figure 2C:
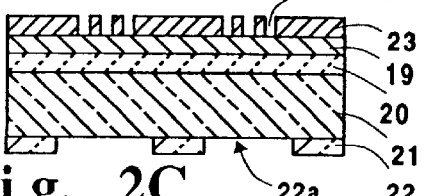
Figure 2D:
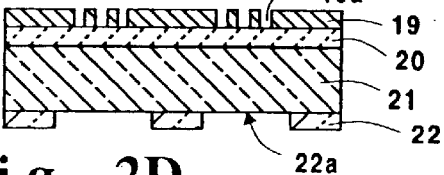

In FIG. 2C an imageable resist 23 is shown formed on the surface of frontside hardmask layer 19 and is patterned with openings 23a. The resist is used to pattern frontside hardmask layer 19 forming openings 19a in the layer as shown in FIG. 2D.

Figure 2E:
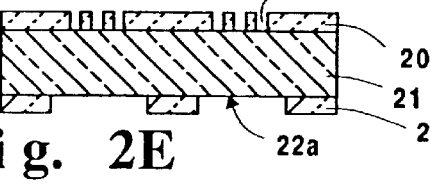

In FIG. 2E the stencil pattern forming layer 20 is then etched in the pattern of the frontside hardmask layer 19 forming openings 20a in the stencil pattern forming layer 20.

Figure 2F:
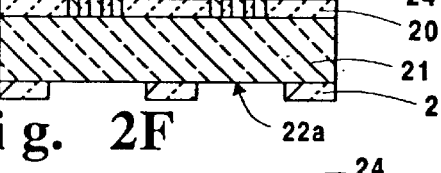
Figure 2G:
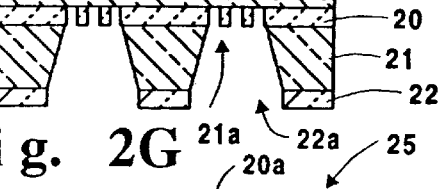
Figure 2H:
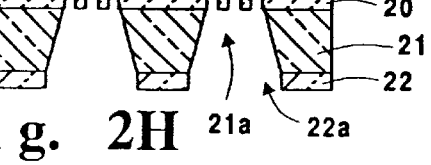

In FIG. 2F after removal of the hardmask layer 19, a frontside protective layer 24 is formed on the surface of patterned stencil pattern forming layer 20. The protective layer 24 may be SiON, $SiO_2$, SiC, silicon nitride, metal such as Ti and Cr, metal oxide such as aluminum oxide, chromium oxide, indium tin oxide and titanium oxide or metal nitride such as titanium nitride and AlN and is usually formed by PECVD (plasma enhanced CVD) but could also be applied by sputtering, CVD, evaporation or spin-on (from liquid phase). The next step is shown in FIG. 2G wherein the substrate 21 is etched forming window openings 21a in the substrate. The window openings 21a correspond to openings 22a in the etched backside hardmask layer 22 forming windows defined by openings 21a and 22a, which windows are below the patterned openings 20a of stencil pattern forming layer 20. The frontside protective layer 24 is then removed as shown in FIG. 2H forming the final stencil mask shown as numeral 25.

As with the method of the invention shown in FIGS. 1A–1G, the method of the invention shown in FIGS. 2A–2H may be performed using backside cooling of the mask substrate to control dimension of the mask.

Similarly as with FIGS. 1A–1G, the hardmask layer 19 and backside hardmask layer 22 are both optional but preferred.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of making a stencil or other lithographic mask comprising the steps of:

obtaining a lithographic mask substrate having an upper surface and a lower surface;

etching the lower surface of the substrate to form window openings therein;

depositing a protective layer over the lower surface and window openings of the etched substrate;

etching the upper surface of the substrate forming a desired stencil pattern in the substrate; and removing the protective layer forming the mask.

2. The method of claim 1 wherein the protective layer is selected from the group consisting of SiON, $SiO_2$, SiC, SiN, Ti, Cr, aluminum oxide, chromium oxide, indium tin oxide, titanium oxide, titanium nitride and aluminum nitride.

3. The method of claim 2 wherein the protective layer is SiON deposited by PECVD.

4. The method of claim 1 wherein the substrate has a stencil pattern forming layer on the upper surface thereof which layer is etched to form the desired stencil pattern therein after the protective layer is applied.

5. The method of claim 4 wherein the protective layer is selected from the group consisting of SiON, $SiO_2$, SiC, SiN, Ti, Cr, aluminum oxide, chromium oxide, indium tin oxide, titanium oxide, titanium nitride and aluminum nitride.

6. The method of claim 5 wherein the protective layer is SiON deposited by PECVD.

7. A method for making semiconductor devices using the mask of claim 1.

8. A method of making a stencil or other lithographic mask comprising the steps of:

obtaining a lithographic mask substrate comprising sequential layers of, from bottom to top, a backside mask layer, a window forming substrate layer, and a stencil pattern forming layer, each layer having a lower surface and an upper surface;

etching the backside mask layer to form one or more patterned backside openings;

etching the window forming substrate layer to form window openings therein and exposing a portion of the lower surface of the stencil pattern forming layer;

depositing a protective layer over the etched backside mask layer and etched window forming substrate layer and the exposed portion of the lower surface of the stencil pattern forming layer;

depositing an imageable resist layer on the stencil pattern forming layer upper surface;

patterning the imageable resist;

etching the stencil pattern forming layer forming the pattern on the stencil pattern forming layer;

removing the resist layer; and removing the protective layer forming the mask.

9. The method of claim 8 wherein the protective layer is selected from the group consisting of SiON, SiO$_2$, SiC, SiN, Ti, Cr, aluminum oxide, chromium oxide, indium tin oxide, titanium oxide, titanium nitride and aluminum nitride.

10. The method of claim 9 wherein the protective layer is SiON deposited by PECVD.

11. The method of claim 8 wherein a frontside mask layer is formed on the stencil pattern forming layer, the imageable resist layer is an upper surface of the frontside mask layer and after the imageable resist is patterned, the frontside mask layer is etched followed by etching the stencil pattern forming layer in the pattern on the frontside mask layer and continuing the method to form the mask.

12. The method of claim 11 wherein the protective layer is selected from the group consisting of SiON, SiO$_2$, SiC, SiN, Ti, Cr, aluminum oxide, chromium oxide, indium tin oxide, titanium oxide, titanium nitride and aluminum nitride.

13. The method of claim 12 wherein the protective layer is SiON deposited by PECVD.

14. A method for making semiconductor devices using the mask of claim 8.

15. A method of making a stencil or other lithographic mask comprising the steps of:
 obtaining a lithographic mask substrate having an upper surface and a lower surface;
 etching the upper surface of the substrate forming a stencil pattern;
 depositing a frontside protective layer on the etched substrate upper surface;
 etching the lower surface of the substrate forming window openings in the substrate; and
 removing the frontside protective layer forming the mask.

16. The method of claim 15 wherein the protective layer is selected from the group consisting of SiON, SiO$_2$, SiC, SiN, Ti, Cr, aluminum oxide, chromium oxide, indium tin oxide, titanium oxide, titanium nitride and aluminum nitride.

17. The method of claim 16 wherein the protective layer is SiON deposited by PECVD.

18. A method for making semiconductor devices using the mask of claim 15.

* * * * *